(12) United States Patent
Hayashi (10) Patent No.: US 9,705,061 B2
(45) Date of Patent: Jul. 11, 2017

(54) THERMOELECTRIC CONVERSION MODULE AND METHOD FOR MANUFACTURING THERMOELECTRIC CONVERSION MODULE

(71) Applicant: Yamaha Corporation, Hamamatsu-Shi, Shizuoka-Ken (JP)

(72) Inventor: Takahiro Hayashi, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 13/768,114

(22) Filed: Feb. 15, 2013

(65) Prior Publication Data

US 2013/0213447 A1    Aug. 22, 2013

(30) Foreign Application Priority Data

Feb. 17, 2012    (JP) ................. 2012-032491

(51) Int. Cl.
  H01L 35/32    (2006.01)
  H01L 35/10    (2006.01)
  H01L 35/04    (2006.01)
  H01L 35/08    (2006.01)
  H01L 35/34    (2006.01)

(52) U.S. Cl.
  CPC .............. *H01L 35/32* (2013.01); *H01L 35/04* (2013.01); *H01L 35/08* (2013.01); *H01L 35/10* (2013.01); *H01L 35/34* (2013.01)

(58) Field of Classification Search
  CPC .................... H01L 35/08; H01L 35/32; H01L 35/04–35/10; H01L 35/34
  See application file for complete search history.

(56) References Cited

U.S. PATENT DOCUMENTS

| 3,392,061 | A | 7/1968 | Schreiner et al. | |
| 2005/0241690 | A1 | 11/2005 | Tajima et al. | |
| 2006/0118160 | A1* | 6/2006 | Funahashi et al. | 136/236.1 |
| 2006/0210790 | A1* | 9/2006 | Horio et al. | 428/323 |
| 2009/0272417 | A1* | 11/2009 | Schulz-Harder | 136/203 |
| 2010/0275435 | A1* | 11/2010 | Hiroyama | 29/592.1 |
| 2011/0017254 | A1* | 1/2011 | Stefan et al. | 136/230 |

(Continued)

FOREIGN PATENT DOCUMENTS

| CN | 101101955 A | 1/2008 |
| CN | 100444418 A | 12/2008 |
| JP | A-05-002940 | 1/1993 |

(Continued)

OTHER PUBLICATIONS

Grain Definition; Merriam-Webster Dictionary; pp. 1-2; accessed Jul. 31, 2011; http://www.merriam-webster.com/dictionary/grain.*

(Continued)

*Primary Examiner* — Allison Bourke
*Assistant Examiner* — Edward Schmiedel
(74) *Attorney, Agent, or Firm* — Blank Rome LLP (57) ABSTRACT

A thermoelectric conversion module includes a pair of substrates, electrodes formed on the facing surfaces of a pair of the electrodes, a thermoelectric element disposed between the electrodes, and a joining layer that joins the electrodes and the thermoelectric element, in which the thickness of the joining layer is 30 μm or more, and is formed by sintering paste including metal particles smaller than 100 nm.

9 Claims, 5 Drawing Sheets (56) References Cited

U.S. PATENT DOCUMENTS

2012/0281362 A1* 11/2012 Ishimine et al. .............. 361/707

FOREIGN PATENT DOCUMENTS

| JP | 2004-273489 A | 9/2004 |
|----|---------------|--------|
| JP | A-2005-353710 | 12/2005 |
| JP | A-2009-117792 | 5/2009 |
| JP | A-2010-182940 | 8/2010 |

OTHER PUBLICATIONS

Machine translation of CN 101101955; original published Sep. 1, 2008; accessed and printed Aug. 6, 2015.*
Ma, Bingqian et al.; Structural morphologies of Cu—Sn—Bi immiscible alloys with varied compositions; Journal of Alloys and Compounds; 535 (2012) 95-101; published May 3, 2012; http://www.sciencedirect.com/science/article/pii/S0925838812006871.*
European Search Report issued for counterpart application EP 13 00 0795, mailing date Apr. 3, 2014.
Office Action, China, Appl. No. 201310131775.8, Apr. 23, 2015, with translation.
Office Action from corresponding Japanese Application No. 2013-025436 issued Apr. 4, 2017.
Office Action from corresponding Japanese Application No. 2013-025436 issued Nov. 22, 2016 (Machine translation obtained by Global Dossier on Nov. 22, 2016).

* cited by examiner

THERMOELECTRIC CONVERSION MODULE AND METHOD FOR MANUFACTURING THERMOELECTRIC CONVERSION MODULE

BACKGROUND OF THE INVENTION

Field of the Invention

The present invention relates to a thermoelectric conversion module and a method for manufacturing a thermoelectric conversion module.

Priority is claimed on Japanese Patent Application No. 2012-32491, filed on Feb. 17, 2012, the contents of which are incorporated herein by reference.

Description of Related Art

In the past, a thermoelectric material has been used for a variety of purposes in order to carry out conversion between heat and electric power. For example, a thermoelectric conversion module has been developed in which an n-type thermoelectric material and a p-type thermoelectric material are connected in series and are disposed side by side between facing substrates so that one substrate is used as a high-temperature portion, and the other substrate is used as a low-temperature portion. The thermoelectric conversion module is used for conversion of heat supplied to the thermoelectric conversion module from the high-temperature portion into electric power, cooling at the low-temperature portion through electric conducting, and the like.

In the above configuration, while the temperature at the high-temperature portion is varies, in order to use the thermoelectric conversion module in a temperature range exceeding the melting point of solder, a technique for manufacturing the thermoelectric conversion module, in which solder is not used, has been developed. For example, Japanese Unexamined Patent Application, First Publication No. 2004-273489 discloses a technique in which a thermoelectric element or the like is welded by coating conductive paste having fine metal particles with an average particle diameter of 1 to 10 nm dispersed in liquid on the thermoelectric element, an electrode sheet or the like, and then sintering the fine metal particles.

In the technique of the related art, it was not possible to configure a thermoelectric conversion module which was durable enough to withstand use in an operation condition of a large temperature difference between the high-temperature portion and the low-temperature portion. For example, in a case in which power is generated using a thermoelectric element, it is assumed that a thermoelectric conversion module is used in an environment in which the high-temperature portion becomes 300° C. or more, and the low-temperature portion becomes room temperature (approximately 25° C.). In such an environment, a large temperature difference is caused between the high-temperature portion and the low-temperature portion in the thermoelectric conversion module, and a large temperature difference is also caused between the thermoelectric element and an electrode. Generally, since the thermoelectric element and the electrode have totally different components, in an operation environment in which a large temperature difference is caused, the degrees of thermal expansion are significantly different at the thermoelectric element and the electrode, and a large thermal stress is caused between the thermoelectric element and the electrode. Therefore, even when a joining layer is formed using fine metal particles, breakage or the like of the joining layer occurs in the technique of the related art in which the mitigation of thermal stress is not assumed.

SUMMARY OF THE INVENTION

The present invention has been made in consideration of the above problems, and an object of the invention is to provide a thermoelectric conversion module which can be used in an operation condition with a large temperature difference.

In order to solve the above problems, a thermoelectric conversion module according to the present invention includes electrodes formed on the facing surfaces of a pair of substrates, a thermoelectric element disposed between the electrodes, and a joining layer that joins the electrodes and the thermoelectric element, in which the thickness of the joining layer is set to 30 μm or more. Furthermore, the joining layer includes a first layer having an average crystal grain diameter of more than 1 μm and less than or equal to 10 μm and a second layer having an average crystal grain diameter of more than 10 μm.

That is, since the joining layer is formed to be as thick as 30 μm or more, and includes the first layer having an average crystal grain diameter of more than 1 μm and less than or equal to 10 μm and the second layer having an average crystal grain diameter of more than 10 μm, even when thermal stress, which is caused by use of the thermoelectric conversion module, is exerted to the joining layer between the electrodes and the thermoelectric element, it is possible to mitigate the thermal stress. As a result, it is possible to prevent the breakage of the thermoelectric conversion module.

Furthermore, the method for manufacturing a thermoelectric conversion module according to the present invention has the steps of forming the electrodes on the facing surfaces of a pair of the substrates; disposing the thermoelectric element between the electrodes; forming paste including metal particles smaller than 100 nm between the electrodes and the thermoelectric element, and sintering the paste so as to form a joining layer which joins the electrodes and the thermoelectric element, the joining layer having a thickness of 30 μm or more. Since the joining layer is formed by sintering the paste including metal particles smaller than 100 nm, metal particles having a grain diameter less than 100 nm before sintering form larger crystal grains after sintering and strongly bond to each other so as to configure the joining layer. As a result, the strength of the joining layer becomes strong. In addition, the electric conductivity of the joining layer becomes large, and it is possible to prevent a decrease in the thermoelectric conversion efficiency in the thermoelectric conversion module.

In an embodiment of the invention, a pair of the substrates needs to be capable of holding the thermoelectric element in a state in which the thermoelectric element is interposed therebetween, one substrate forms the high-temperature portion, and the other substrate forms the low-temperature portion. In addition, at least one surface of the substrate is formed in a planar shape (or curved shape), and the thermoelectric conversion module is configured to have the thermoelectric element disposed between the surfaces of the substrates in a state in which the surfaces of a pair of the substrates are in parallel with each other. Additionally, in order to increase the thermoelectric conversion efficiency, it is preferable that heat is efficiently transmitted from the high-temperature portion to the thermoelectric element, and heat is efficiently transmitted from the thermoelectric element to the low-temperature portion. Therefore, the substrate may be configured of a member having a high thermal conductivity, or a cooler (fan, fin, or the like) may be provided in order to increase the heat dissipation efficiency in the low-temperature portion.

In the embodiment of the invention, it needs to be possible to electrically connect the thermoelectric element so as to enable thermoelectric conversion in the thermoelectric conversion module by forming the electrode on the facing surfaces of the substrates, and joining the thermoelectric element to the electrodes. For example, in a configuration in which a plurality of n-type thermoelectric elements and a plurality of p-type thermoelectric elements are interposed between the substrates, and the thermoelectric elements are connected using a plurality of electrodes, in a case in which an n-type thermoelectric element and a p-type thermoelectric element are electrically connected through an electrode on one substrate, the n-type thermoelectric element and the p-type thermoelectric element are connected to a different electrode on the other substrate. That is, electrically, the n-type thermoelectric element and the p-type thermoelectric element are sequentially connected in series, and the n-type thermoelectric element and the p-type thermoelectric element are connected through the electrode. Furthermore, the respective electrodes disposed between the n-type thermoelectric elements and the p-type thermoelectric elements are configured in a state in which the electrodes are mutually joined to a pair of the substrates. Needless to say, herein, a collateral configuration for appropriate thermoelectric conversion, for example, a configuration in which a member for ensuring electrical insulation between the electrode and the electrode (insulating member or the like) is attached to the electrodes and the like may be employed.

In the embodiment of the invention, the thermoelectric element is formed of a thermoelectric material, with which thermoelectric conversion is possible, into a prescribed size and shape, and the thermoelectric element needs to be configured to be disposed between a pair of the substrates. Needless to say, a plurality of the thermoelectric elements may be provided, and the thermoelectric element may be configured of an n-type thermoelectric element and a p-type thermoelectric element.

In the embodiment of the invention, the joining layer is formed in order to join the electrodes and the thermoelectric element and can be formed using a variety of methods, and the thickness thereof is at least 30 μm or more. That is, the thickness of the joining layer needs to be adjusted so that thermal stress exerted between the thermoelectric element and the electrodes can be mitigated. In addition, the joining layer is formed by sintering paste including metal particles smaller than 100 nm, and the sintering needs to form at least some of the joining layer.

That is, in the embodiment of the invention, the paste is in a state in which metal particles are included in a flowable solvent, and thus the paste itself is flowable; however, after sintering, the solvent is volatilized, and the metal particles remain such that the paste is in a non-flowable state. Simultaneously, the metal particles bond with each other so as to be in a state of a low electrical resistance, whereby the electrodes and the thermoelectric element are electrically joined. Therefore, the paste needs to be used as follows: before the thermoelectric element and the electrodes are joined, the paste is present between the thermoelectric element and the electrodes, the locations of the thermoelectric element and the electrodes are adjusted to the prescribed locations in a state in which the mutual locations can be freely changed, and sintering is carried out after the adjustment of the locations, whereby the thermoelectric element and the electrodes are fixed to the locations. Therefore, at least some of the joining layer in the thickness direction needs to be formed through the sintering of the paste. Needless to say, all of the joining layers of 30 μm or more may be formed through the sintering of the paste.

In addition, in the embodiment of the invention, the paste needs to include metal particles smaller than 100 nm, and the size of the metal particles or the kinds of elements may be selected so that the particles are bound to each other through sintering, and the thermoelectric element and the electrodes are electrically connected after sintering. In addition, the solvent that configures the paste is preferably an organic solvent. That is, in the case of a paste having the metal particle dispersed in an organic solvent, the organic solvent can be volatilized through sintering, and it is possible to prevent an increase in the electric conductivity due to the solvent component after sintering. In addition, the size of the metal particles may be, for example, between 10 to 100 nm. That is, since metal particles of 10 nm or smaller are likely to be oxidized, when metal particles between 10 to 100 nm are used, it is possible to form a joining layer while suppressing the amount of oxygen included in the joining layer.

In addition, in the embodiment of the invention, as an example of the sintering, a configuration may be employed in which sintering is carried out at a temperature at which the metal particles are coarsened, but the crystal grains of the thermoelectric element are not coarsened. That is, in order to ensure the strength of the joining layer after sintering, it is necessary to bond the metal particles in the paste to each other through sintering and to prevent the breakage of the bonds due to thermal stress. Therefore, when the sintering is carried out at a temperature at which the metal particles are coarsened, the metal particles bond with each other so as to be coarsened in the sintering step, a state in which the bonds are not broken due to thermal stress after sintering can be formed, and a joining layer with a high strength can be formed.

Furthermore, in the embodiment of the invention, in order to maintain the performance of the high-performance thermoelectric element, it is preferable to change the state of crystals in the thermoelectric element. That is, in order to improve the performances of the thermoelectric element, it is necessary to increase a performance index $Z=\alpha^2/(\rho \times \kappa)$ ($\alpha$ represents the Seebeck coefficient), and it is preferable that the electric resistivity $\rho$ be small and that the thermal conductivity $\kappa$ be small. In a polycrystalline substance, since the electric resistivity $\rho$ increases as the crystal grains are finer and the orientations of the crystal axes are highly disordered, in order to decrease the electric resistivity $\rho$, the crystal grains are preferably large. However, when the crystal grains become large so that the degree of the orientation of the crystal becomes uniform, the thermal conductivity $\kappa$ increases. Therefore, in terms of an increase in the performance index Z, the electric resistivity $\rho$ and the thermal conductivity $\kappa$ have a trade-off relationship; however, generally, in a thermoelectric material based on BiTe or the like, the electric resistivity $\rho$ decreases in a material in which the crystal axes are highly oriented, and the crystal axes gather in a specific direction. Therefore, a thermoelectric material having a small electric resistivity $\rho$ and a small thermal conductivity $\kappa$ is manufactured by orienting the crystal axes in a specific direction in an appropriately miniaturized polycrystalline material, and the performance of a thermoelectric material is improved. In addition, a high-performance thermoelectric element is manufactured by cutting a thermoelectric material having improved performance.

Therefore, in the embodiment of the invention, when the joining layer is formed by carrying out sintering at a temperature at which the crystal grains in the high-performance thermoelectric element are coarsened, the performance of the thermoelectric element degrades. Therefore, when the sintering is carried out at a temperature lower than the temperature at which the crystal grains in the thermoelectric element are coarsened, it is possible to prevent degradation of the performance of the thermoelectric element through sintering.

Furthermore, in the embodiment of the invention, the joining layer may be configured to include a sintered layer formed by sintering the paste and a plated layer adjacent to the sintered layer, and the plated layer may be formed of the same metal as the metal particles included in the paste through plating. That is, when the plated layer formed of the same metal as the metal particles included in the paste is formed in at least one of the electrodes and the thermoelectric element before the sintering, and the sintering is carried out in a state in which the plated layer and the paste are in contact with each other, since the metal particles and the plated layer easily bond with each other during the sintering, the strength of the joining layer can be made high. Additionally, the plated layer may be formed adjacent to the sintered layer, may be formed on one side in the thickness direction when seen from the sintered layer, or may be formed on both sides. That is, when an increase in the strength through the plated layer is required on both sides of the sintered layer, the plated layer may be formed on both sides, and, when an increase in the strength through the plated layer is required on only one side of the sintered layer, the plated layer may be formed on only one side.

In addition, in the embodiment of the invention, the average grain diameters are generally different in the plated layer and the sintered layer. For example, it can be stated that a first layer having an average crystal grain diameter of more than 1 μm and less than or equal to 10 μm is formed by sintering the paste including metal particles smaller than 100 nm, while a second layer having an average crystal grain diameter of more than 10 μm is formed through plating. Therefore, according to the embodiment of the invention, it is also possible to form the joining layer including the first layer and the second layer. Needless to say, there may be more than one of the first layer and the second layer to be formed.

In addition, in the embodiment of the invention, in a case in which at least some of the joining layer is formed by sintering the paste, there are many cases in which, due to oxidation at portions in contact with the paste (for example, the thermoelectric element, the electrodes, the plated layer on the thermoelectric layer, the plated layer on the electrodes, and the like) before the sintering, the concentration of oxygen locally increases. Therefore, the concentration of oxygen is high at two portions interposing the paste before the sintering. In addition, each time the sintering using the paste is repeated, portions having a high concentration of oxygen are increased. Therefore, according to the invention, it is also possible to form a joining layer including a plurality of layers with a high concentration of oxygen in which boundaries are formed at locations at which the change in the concentration of oxygen in the thickness direction exceeds a predetermined reference.

In addition, in the embodiment of the invention, the predetermined reference needs to be suitable to determine whether or not the concentration of oxygen at an arbitrary location in the layer becomes large compared to the concentration of oxygen in other locations. For example, a configuration can be employed in which the difference in the concentration of oxygen after the sintering between a portion in contact with the peripheral gas, such as air, and a portion not in contact with such gas before the sintering is statistically determined, and a predetermined reference is set for the change in the concentration of oxygen per distance so that both can be distinguished. The concentration of oxygen can be evaluated using a variety of indices, and the concentration of oxygen may be evaluated using the concentration of oxygen per area or per volume, or may be evaluated using the amount or observation frequency of oxygen observed using a specific observation method. Needless to say, the concentration of oxygen may be evaluated using an absolute amount, or may be evaluated using a relative amount.

Furthermore, in the embodiment of the invention, a layer having a variety of functions may be formed adjacent to the joining layer. For example, a diffusion prevention layer that prevents the diffusion of a material may be formed at a interposed portion between the joining layer and the thermoelectric element or between the joining layer and the electrodes and both of the interposed portions. That is, in the interface between the joining layer and the thermoelectric element, the diffusion of a material in the joining layer toward the thermoelectric element or the diffusion of a material in the thermoelectric element toward the joining layer may occur. In addition, in the interfaces between the joining layer and the electrodes, the diffusion of a material in the joining layer toward the electrode or the diffusion of a material in the electrode toward the joining layer may occur.

Therefore, in order to prevent the above diffusion, when a layer is formed of a material in which diffusion does not easily occur, the layer functions as the diffusion prevention layer. The material which functions as the diffusion prevention layer can be selected depending on the compositions of the joining layer, the thermoelectric element, and the electrodes, and, for example, in metal, such as Ag or Cu, or a BiTe-based thermoelectric material, when the layer is formed of Ni, the layer functions as the diffusion prevention layer.

Furthermore, in the embodiment of the invention, the sintering can be carried out under a variety of environments, and, for example, a configuration in which the sintering is carried out in a state in which a pressure is applied to the joining layer from the electrodes and the thermoelectric element may be employed. That is, the sintering is carried out in an environment in which a pressure is applied so that the joining layer is compressed. According to the above configuration, the content rate of voids in the sintered layer can be decreased compared to the sintering in an unpressurized state, and it is possible to decrease the electric resistance of the sintered layer.

DETAILED DESCRIPTION OF THE INVENTION

Here, an embodiment of the invention will be described in the following order: (1) A method for manufacturing a thermoelectric conversion module; (2) Examples; and (3) Alternative embodiment.

(1) A Method for Manufacturing a Thermoelectric Conversion Module

Figure 1:
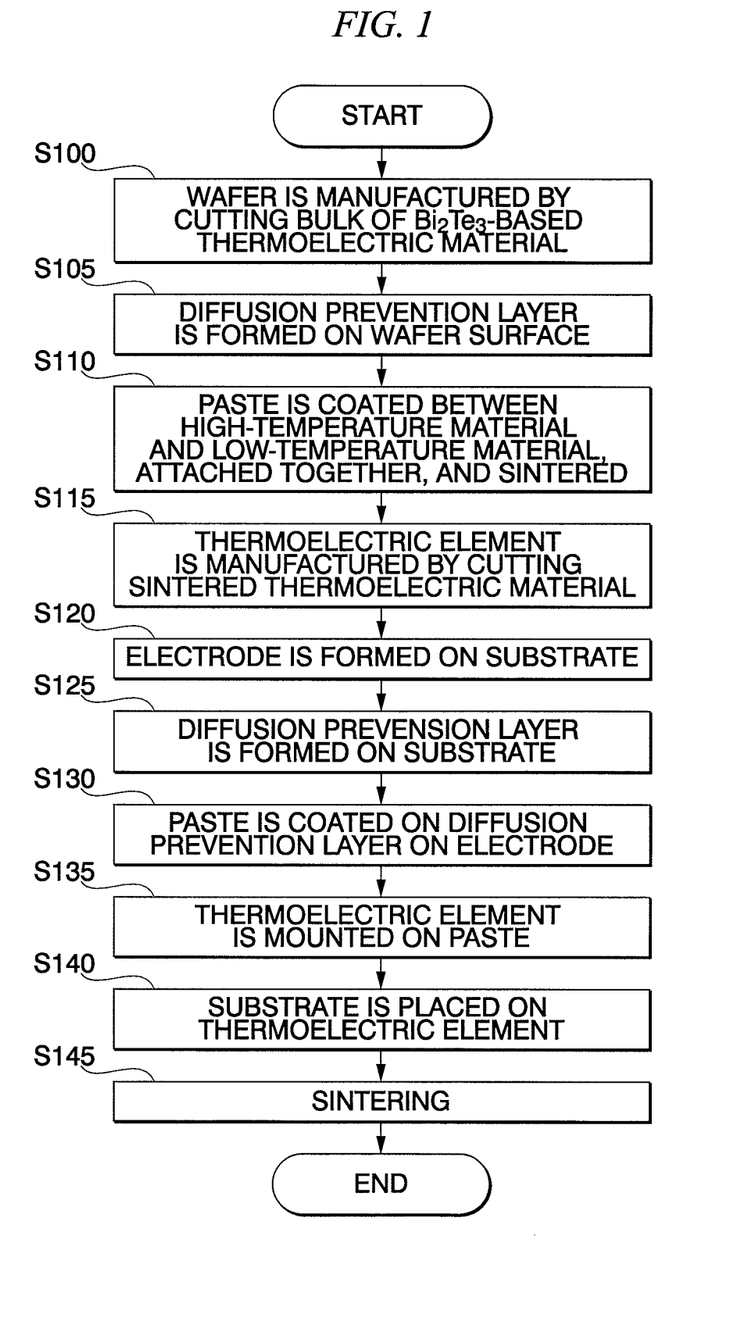
FIG. 1 is a flow chart illustrating a method for manufacturing a thermoelectric conversion module according to an embodiment of the invention.

FIG. 1 is a flow chart illustrating an embodiment of a method for manufacturing a thermoelectric conversion module. The method for manufacturing a thermoelectric conversion module in the embodiment is carried out after bulks of a thermoelectric material is manufactured. That is, before the method for manufacturing a thermoelectric conversion module illustrated in FIG. 1 is carried out, bulks of an n-type thermoelectric material and a p-type thermoelectric material are manufactured in advance. The n-type thermoelectric material and the p-type thermoelectric material according to the embodiment are $Bi_2Te_3$-based thermoelectric materials, and the n-type thermoelectric material and the p-type thermoelectric material are manufactured by applying a variety of processing methods to raw materials weighed so as to obtain a composition of $(Bi, Sb)_2(Te, Se)_3$ using at least one element selected from a group consisting of Bi and Sb and at least one element selected from the group consisting of Te and Se.

In addition, even when the composition ratio of (Bi, Sb) and (Te, Se) is slightly deviated from 2:3, the n-type thermoelectric material and the p-type thermoelectric material are $Bi_2Te_3$-based thermoelectric materials as long as the crystal structure (a rhombohedral crystal structure with a space group R3m) is the same as in $Bi_2Te_3$.

The $Bi_2Te_3$-based n-type thermoelectric material and p-type thermoelectric material can be manufactured by carrying out processes using, for example, an extrusion treatment (a hot pressing method or the like), an extrusion treatment accompanied by plastic deformation (a shear supplying extrusion method, an ECAP method, a hot forging method or the like), a rolling treatment, an uniaxial solidification method, a single crystal method or the like so that specific crystal axes are oriented in specific orientations. The bulks of a thermoelectric material, which are prepared in advance in the embodiment, are an n-type thermoelectric material and a p-type thermoelectric material, and are configured of a high-temperature material having a relatively high performance index in the temperature range of a high-temperature portion and a low-temperature material having a relatively high performance index in the temperature range of a low-temperature portion.

Figure 2:
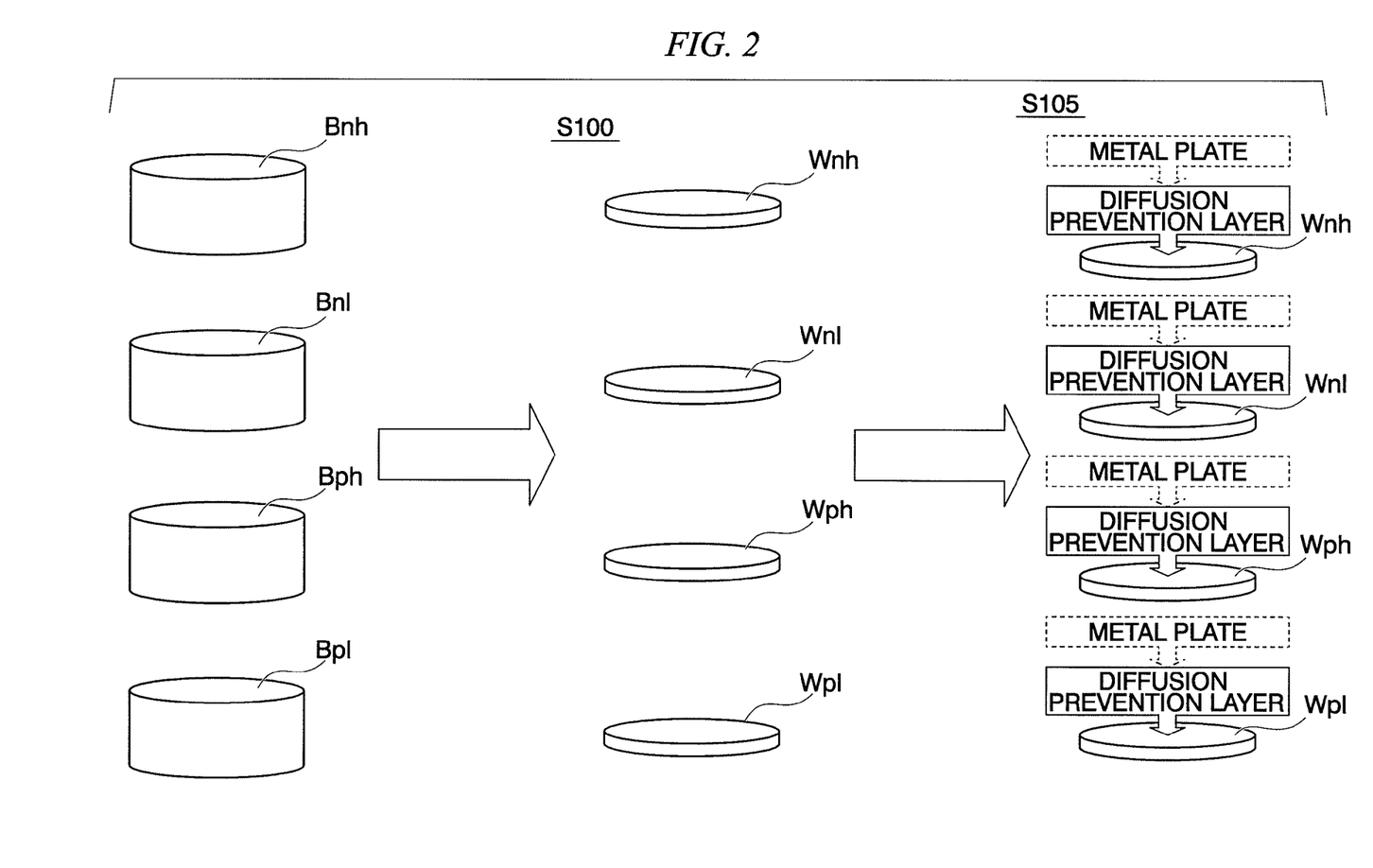
FIG. 2 is a view schematically illustrating the method for manufacturing a thermoelectric conversion module according to the embodiment of the invention.

FIGS. 2 and 3 are views schematically illustrating the process subject in principle steps of the manufacturing method illustrated in FIG. 1. In FIG. 2, bulks, which were manufactured before the manufacturing illustrated in FIG. 1 was carried out, are illustrated using Bnh, Bnl, Bph and Bpl. Here, the bulk Bnh represents a high-temperature material of the n-type thermoelectric material, the bulk Bnl represents a low-temperature material of the n-type thermoelectric material, the bulk Bph represents a high-temperature material of the p-type thermoelectric material, and the bulk Bpl represents a low-temperature material of the p-type thermoelectric material. That is, the thermoelectric material of the bulk Bnh has a higher performance index than the thermoelectric material of the bulk Bnl in a high temperature range (a temperature range near 300° C.) and has a lower performance index than the thermoelectric material of the bulk Bnl in a low temperature range (a temperature range near 50° C.). Similarly, the thermoelectric material of the bulk Bph has a higher performance index than the thermoelectric material of the bulk Bpl in a high temperature range (a temperature range near 300° C.) and has a lower performance index than the thermoelectric material of the bulk Bpl in a low temperature range (a temperature range near 50° C.).

In the manufacturing method illustrated in FIG. 1, the $Bi_2Te_3$-based thermoelectric materials of the bulks Bnh, Bnl, Bph and Bpl are cut so as to manufacture thin plate-like wafers (Step S100). In the embodiment, since a cuboid thermoelectric element is manufactured by forming a joining layer between two wafers through the step described below, the thicknesses of the wafers are set to become the thicknesses determined in advance according to the size of the thermoelectric element. In FIG. 2, a wafer manufactured using the bulk Bnh of the n-type thermoelectric material is represented by Wnh, a wafer manufactured using the bulk Bnl of the n-type thermoelectric material is represented by Wnl, a wafer manufactured using the bulk Bph of the p-type thermoelectric material is represented by Wph, and a wafer manufactured using the bulk Bpl of the p-type thermoelectric material is represented by Wpl.

In addition, in the embodiment, since the joining layer is formed between the thermoelectric materials, and the joining layers are also formed between the thermoelectric element and the electrodes, the former will be called an inter-material joining layer, and the latter will be called an element-electrode joining layer. In addition, in other similar layers as well, the layers are classified into inter-material layers and inter-electrode layers as necessary. For example, an A layer between the thermoelectric materials is called an inter-material A layer, and an A layer between the thermoelectric element and the electrode is called an element-electrode A layer.

When the wafers are manufactured, next, the diffusion prevention layer is formed on the surface of the wafer (Step S105). The diffusion prevention layer formed in Step S105 can be present between the thermoelectric materials and also can be present between the thermoelectric element and the electrode. Therefore, the diffusion prevention layer can become both an inter-material diffusion prevention layer and an element-electrode diffusion prevention layer. In addition, on the wafer on which the diffusion prevention layer has been formed, a treatment for forming a metal plated layer using the same metal as the metal particles included in the paste described below may be further carried out. In FIG. 2, the formation of the diffusion prevention layer through Step S105 is illustrated using solid line rectangles, and the fact that the metal plated layer may be formed is illustrated using broken line rectangles.

Figure 3:
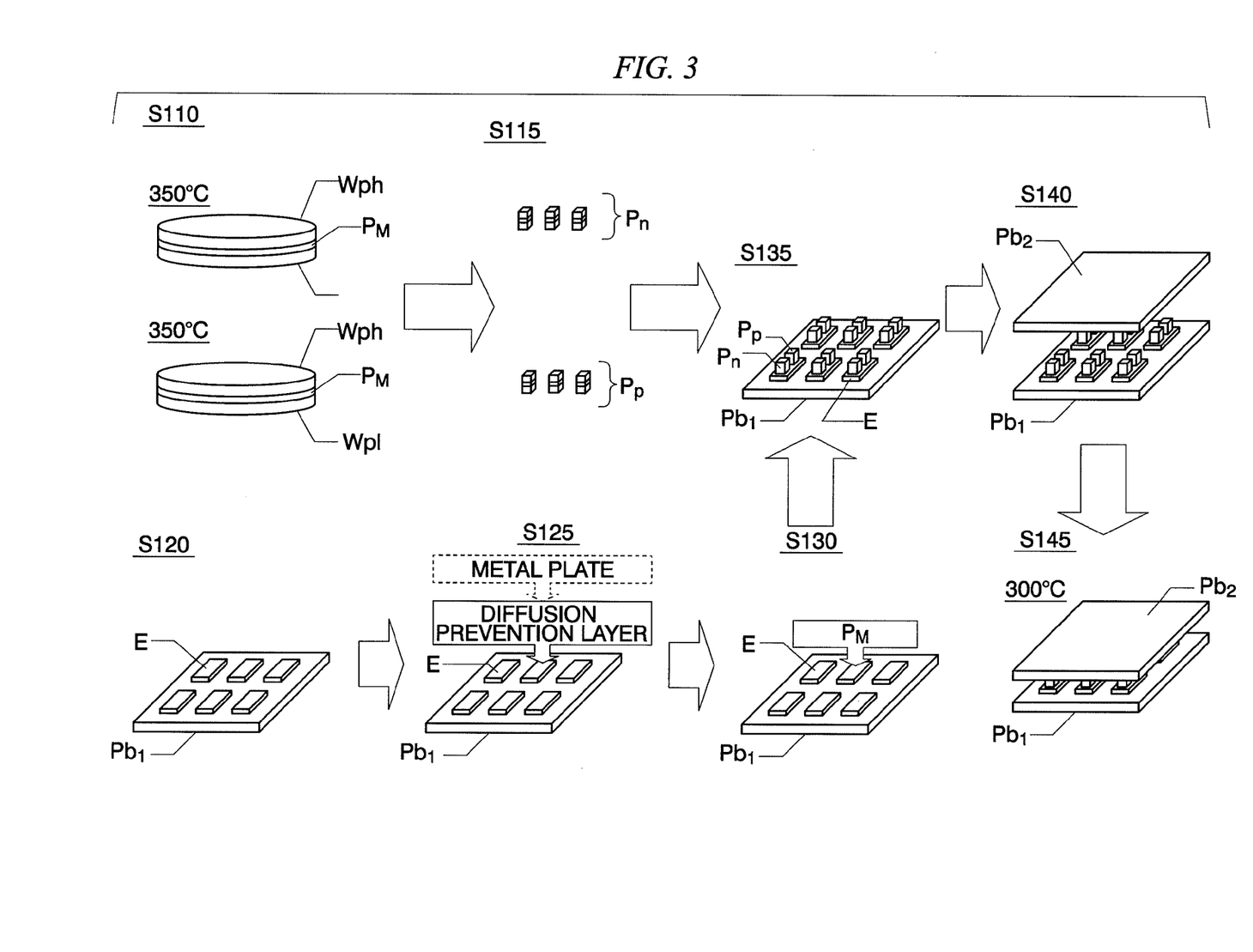
FIG. 3 is a view schematically illustrating the method for manufacturing a thermoelectric conversion module according to the embodiment of the invention, subsequent to FIG. 2.

When plating is carried out, paste including metal particles smaller than 100 nm is coated between the high-temperature material and the low-temperature material, and sintering is carried out in a state in which the high-temperature material and the low-temperature material are attached together (Step S110). In the embodiment, a sintering subject is transported into a reflow furnace, the inside of the reflow furnace is set to a predetermined atmosphere (vacuum, argon, nitrogen, air or the like), and then sintering is carried out by heating the subject at a predetermined sintering temperature for a predetermined time. Here, as illustrated in FIG. 3, sintering is carried out in a state in which paste $P_M$ is interposed between the wafer Wnh of the high-temperature material and the wafer Wnl of the low-temperature material of the n-type thermoelectric material, and sintering is carried out in a state in which the paste $P_M$ is interposed between the wafer Wph of the high-temperature material and the wafer Wpl of the low-temperature material of the p-type thermoelectric material.

The sintering temperature is a temperature at which the metal particles smaller than 100 nm, which are included in the paste, are coarsened, and the crystal grains in the thermoelectric material are not coarsened. That is, the paste in the embodiment includes metal particles smaller than 100 nm, and, when the fine metal particles are heated, the crystals bond with each other at a temperature significantly lower than the melting point of the metal so that the metal particles coarsen. In addition, an organic solvent is volatilized. When the metal particles are coarsened through this sintering, the paste lose the fluidity, and are strongly solidified. In addition, the solidified portions are not melted until the temperature reaches the melting point of the metal, and maintain a stabilized solid state even in a case in which the portions are heated to approximately 300° C., which is assumed to be the high-temperature portion of the thermoelectric conversion module.

Therefore, the paste before sintering become the inter-material joining layers which strongly join the thermoelectric materials after sintering, and function as layers that strongly join the thermoelectric materials even when the portions are heated to a temperature range in which the thermoelectric conversion module is used. It becomes likely that the metal particles in the paste are coarsened as the sintering temperature increases; however, when the sintering temperature is set to an excessively high temperature, the crystal grains in the thermoelectric material are coarsened such that the performance index decreases. Therefore, the sintering temperature is set to a temperature lower than the temperature at which the crystal grains in the thermoelectric material are coarsened.

Furthermore, the predetermined time during which the paste is maintained at the sintering temperature may be set so that the strength of the inter-material joining layer is sufficiently increased due to the coarsening of the metal particles by sintering, and the electric conductivity is sufficiently decreased in the inter-material joining layer, and, for example, a configuration in which the predetermined time is set to be long so that metal particles of 1 μm or more are confirmed after the predetermined time elapses, or the like can be employed. Examples of the paste include silver nano paste manufactured by Dowa Holdings Co., Ltd., NAG-10 manufactured by Daiken Chemical Co., Ltd., MDot manufactured by Mitsuboshi belting Ltd., and the like.

When a wafer-shaped thermoelectric material, in which a layer of the high-temperature material, the inter-material sintered layer derived from the paste, and a layer of the low-temperature layer are integrated, is manufactured as a result of the above sintering, next, the sintered thermoelectric material is cut so as to manufacture a thermoelectric element (Step S115). In the embodiment, in order to manufacture a cuboid thermoelectric element, the cutting directions are set to two perpendicular directions in a circular surface of the wafer. Due to this cutting, a cuboid n-type thermoelectric element Pn and a cuboid p-type thermoelectric element Pp, as illustrated in FIG. 3, are obtained. In each of the n-type thermoelectric element Pn and the p-type thermoelectric element Pp, a structure of a Ni-plated layer (inter-material diffusion prevention layer), an inter-material sintered layer derived from the paste and a Ni-plated layer (inter-material diffusion prevention layer) is formed between the thermoelectric elements, and the outermost layer forms a Ni-plated layer on the surface of the thermoelectric element. The Ni-plated layer on the outermost layer of the thermoelectric element becomes an element-electrode diffusion prevention layer through the subsequent step.

Next, electrodes are formed on the substrate (Step S120). That is, in the embodiment, since a thin rectangular sheet-shaped substrate is used as a portion which supports the thermoelectric element and transmits heat to the thermoelectric element and to which heat is transmitted from the thermoelectric element, the disposition pattern of the electrodes is determined in advance on the substrate so that the thermoelectric elements can be electrically connected in series, and the electrodes are formed on the substrate so as to form the disposition pattern. The shape of the electrode can be realized by forming the electrode pattern using Cu on a ceramic substrate. FIG. 3 schematically illustrates an example in which 3 cuboid electrodes E are transversely formed side by side, and 2 electrodes are vertically (the inward direction in the drawing) formed side by side on a substrate $Pb_1$; however, in a pair of substrates that configure the thermoelectric module, the electrode patterns may be different on one substrate and the other substrate.

Next, the diffusion prevention layer is formed on the electrode surface through Ni plating (Step S125). Since the diffusion prevention layer formed in Step S125 becomes a layer present between the thermoelectric element and the electrode, this diffusion prevention layer becomes an element-electrode diffusion prevention layer. Herein as well, a treatment for forming a metal plated layer may be further carried out after the diffusion prevention layer is formed. In FIG. 3, the formation of the diffusion prevention layer on the surface of the electrode E through Step S125 is illustrated using solid line rectangles, and the fact that the metal plated layer may be formed is illustrated using a broken line rectangle. Steps S120 and S125 may be carried out prior to Step S100.

When the electrode surface is plated, as illustrated in FIG. 3, the paste $P_M$ is coated on the diffusion prevention layer on the electrode (Step S130). Here, the amount of the paste is determined in advance so that the thickness becomes 30 μm or more after sintering. That is, the paste in the embodiment is an organic solvent including metal particles smaller than 100 nm, and, since the organic solvent is all volatilized by sintering, it is possible to set the thickness of a layer formed after sintering (the element-electrode joining layer) to a desired thickness by coating the paste so as to obtain a desired thickness in a case in which the organic solvent is entirely volatilized.

The ratio between the organic solvent and the metal particles is not limited, and, in order to form an element-electrode joining layer having a desired thickness, the amount of the organic solvent is preferably small, and, for example, the weight ratio of the metal particles is preferably 80% or more. More specifically, an element-electrode joining layer having a thickness of 30 μm or more can be formed by using Ag paste from which 0.988 mg of an organic solvent is entirely volatilized by heating 6.3 mg of Ag paste at a predetermined temperature-increase rate, and holding the paste at 310° C. for 30 minutes (that is, 84.3 weight % of Ag particles). Examples of such Ag paste include silver nano paste manufactured by Dowa Holdings Co., Ltd., NAG-10 manufactured by Daiken Chemical Co., Ltd., MDot manufactured by Mitsuboshi belting Ltd., and the like.

Next, the thermoelectric element is mounted on the paste (Step S135). The embodiment illustrates an example in which an n-type thermoelectric element Pn and a p-type thermoelectric element Pp are mounted on an electrode E as illustrated in FIG. 3. Therefore, on six electrodes E, a total of six n-type thermoelectric elements Pn and a total of six p-type thermoelectric element Pp are mounted.

Next, a substrate $Pb_2$ is placed on the thermoelectric element (Step S140), and sintering is carried out (Step S145). That is, a substrate which forms a pair with the substrate having the thermoelectric element mounted on the electrode is selected, placed on the thermoelectric element, and the thermoelectric element interposed between a pair of the substrate is transported into a reflow furnace. In addition, after the inside of the reflow furnace is set to a predetermined atmosphere (vacuum, argon, nitrogen, air or the like), sintering is carried out by heating the thermoelectric element interposed between a pair of the substrates at a predetermined sintering temperature for a predetermined time. The substrate $Pb_2$ placed on the thermoelectric element as illustrated in FIG. 3 is a substrate on which the electrodes are formed according to a pattern at which the respective mounted thermoelectric elements are connected in series so that the n-type thermoelectric element and the p-type thermoelectric element are mutually connected.

Herein as well, the sintering temperature is a temperature at which the metal particles are coarsened, and the crystal grains in the thermoelectric material are not coarsened. That is, the sintering temperature is set so that portions which were the paste before the sintering function as the element-electrode joining layers that strongly join the sintered thermoelectric elements and the electrodes. The sintering temperature is set to a temperature lower than the temperature at which the crystal grains in the thermoelectric element coarsen in order to prevent the coarsening of the crystal grains in the thermoelectric element and a consequent decrease in the performance index. In addition, the predetermined time is set so that the strength of the element-electrode joining layer is sufficiently increased or the electric conductivity in the element-electrode joining layer is sufficiently decreased due to the coarsening of the metal particles by sintering. Herein as well, a configuration in which the predetermined time is set to be long so that metal particles of 1 μm or more are confirmed after the predetermined time elapses, or the like can be employed.

Figure 4:
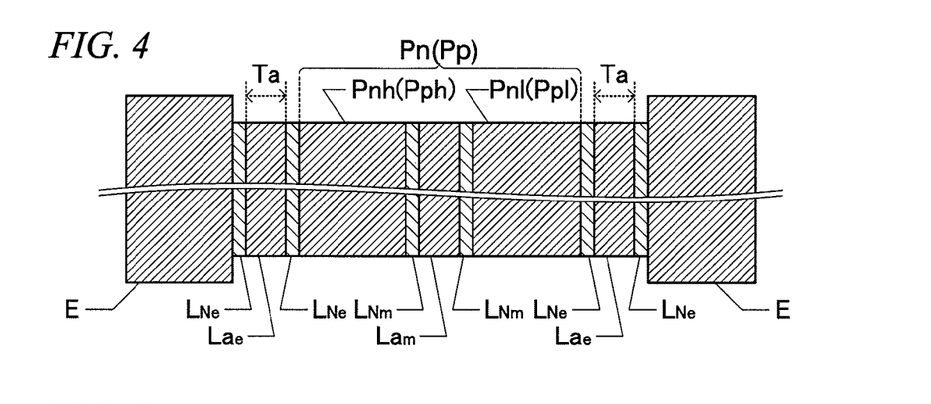
FIG. 4 is a cross-sectional view illustrating the structure between electrodes in a thermoelectric conversion module according to an embodiment of the invention.

FIG. 4 is a cross-sectional view schematically illustrating the structure between the electrodes in the thermoelectric conversion module manufactured in the above manner, and illustrates an appearance in which the thermoelectric elements and the like are cut in the perpendicular direction with respect to the surface having the electrodes formed on the substrate. As illustrated in FIG. 4, in the thermoelectric conversion module, a Ni-plated layer (element-electrode diffusion prevention layer) $L_{Ne}$, an element-electrode joining layer formed by the sintering of the paste Lae, a Ni-plated layer (element-electrode diffusion prevention layer) $L_{Ne}$, a high-temperature material Pnh (or Pph), a Ni-plated layer (inter-material diffusion prevention layer) $L_{Nm}$, an inter-material joining layer formed by the sintering of the paste Lam, a Ni-plated layer (inter-material diffusion prevention layer) $L_{Nm}$, a low-temperature material Pnl (or Ppl), a Ni-plated layer (element-electrode diffusion prevention layer) $L_{Ne}$, an element-electrode joining layer formed by the sintering of the paste Lae and a Ni-plated layer (element-electrode diffusion prevention layer) $L_{Ne}$ are formed sequentially in the thickness direction of the thermoelectric element between the electrodes E and E.

The thermoelectric conversion module according to the embodiment is used for power generation and the like in a state in which the temperature difference between the high-temperature portion and the low-temperature portion is large. In such use, for example, the temperature at the high-temperature portion is set to approximately 300° C., and the temperature at the low-temperature portion is set to approximately 50° C. In this case, in FIG. 4, one electrode E reaches approximately 300° C., and the other electrode E reaches approximately 50° C. so that the temperature difference between both electrodes becomes approximately 250° C. Therefore, a large temperature difference is caused between the electrodes E, and a large temperature difference is also caused between the electrode E and the thermoelectric element (Pnh, Pnl, or the like).

That is, when the thermal expansion coefficients of a plurality of layers are compared, in general, the thermal expansion coefficients are significantly different in a case in which the compositions of the materials are significantly different. Therefore, in the thermoelectric conversion module according to the embodiment, the thermal expansion coefficients of the thermoelectric elements (Pnh, Pnl and the like) and the thermal expansion coefficients of the electrode E are significantly different, a large thermal stress is exerted to the layer between the electrode E and the thermoelectric element (Pnh, Pnl, or the like) due to the large temperature difference. However, in the embodiment, the thickness Ta of the element-electrode joining layer Lae is adjusted through the above manufacturing step so as to become 30 μm or more. Therefore, even when a large thermal stress is generated between the electrode E and the thermoelectric element (Pnh, Pnl, or the like) in which the element-electrode joining layer Lae is interposed, the thermal stress can be mitigated by the element-electrode joining layer Lae, and breakage (breakage due to the mechanical contact or electrical contact with the electrode E and the thermoelectric element (Pnh, Pnl, or the like)) can be prevented.

Furthermore, the element-electrode joining layer Lae is formed by sintering the paste including metal particles smaller than 100 nm. In this sintering step, the metal particles, which are included in the organic solvent and are smaller than 100 nm, become coarse, and metal particles of 1 μm or more are observed. Therefore, the sintered element-electrode joining layer Lae becomes a layer including metal particles of 1 μm or more, the metal particles are not immediately coarsened at the sintering temperature, and the element-electrode joining layer Lae is stabilized. In addition, the element-electrode joining layer Lae becomes a layer including metal particles of 1 μm or more so that the bonds between the metal particles become stronger than those before sintering.

Therefore, even when the thermoelectric conversion module is used in a state in which the temperature difference between the high-temperature portion and the low-temperature portion becomes approximately 250° C. as described above, it is possible to use the thermoelectric conversion module in a state in which the state of the element-electrode joining layer Lae does not change without changing the state of the metal particles again in the element-electrode joining layer Lae. In addition, even when a large thermal stress is caused between the electrode E and the thermoelectric element Pn (or Pp), it is possible to prevent the breakage of the element-electrode joining layer Lae, and it becomes possible to mitigate the thermal stress through the element-electrode joining layer. Furthermore, due to the coarsening of the metal particles by sintering, the effective cross-sectional area in the element-electrode joining layer Lae becomes large, and the electric conductivity of the element-electrode joining layer Lae becomes large. As a result, it is possible to prevent a decrease in the thermoelectric conversion efficiency in the thermoelectric conversion module.

(2) Examples

Next, examples of the thermoelectric conversion module manufactured using the above manufacturing method will be described. In the present example, a substance formed by adding 0.3 weight % of Te to a raw material having a composition ratio of $Bi_{1.9}Sb_{0.1}Te_{2.5}Se_{0.5}$ was used as the starting raw material of the high-temperature material of the n-type thermoelectric material, and a raw material having a composition ratio of $Bi_{1.9}Sb_{0.1}Te_{2.7}Se_{0.3}$ was used as the starting raw material of the low-temperature material of the n-type thermoelectric material. In addition, a raw material having a composition ratio of $Bi_{0.2}Sb_{1.8}Te_{2.85}Se_{0.1}$ was used as the starting raw material of the high-temperature material of the p-type thermoelectric material, and a raw material having a composition ratio of $Bi_{0.5}Sb_{1.5}Te_3$ was used as the starting raw material of the low-temperature material of the p-type thermoelectric material.

In the example, Bi, Sb, Te and Se were weighed, the compositions of the respective elements were adjusted so as to form the respective starting materials as described above, the respective starting materials were heated to 700° C. in an argon atmosphere so as to be melted, and stirred. Furthermore, the stirred and melted starting raw materials were cooled and solidified, thereby producing alloys of the high-temperature material and low-temperature material of the n-type thermoelectric material and the high-temperature material and low-temperature material of the p-type thermoelectric material.

Furthermore, the respective obtained alloys were crushed or subjected to a liquid quenching treatment, thereby manufacturing powder of the thermoelectric materials. The crushing can be carried out using a ball mill, a stamp mill or the like, and the liquid quenching treatment can be carried out using a roll-type liquid quenching apparatus, a rotary disc apparatus, a gas atomizing apparatus or the like. The liquid quenching treatment can be carried out by, for example, quenching an alloy heated to 800° C. in an argon atmosphere.

Furthermore, the respective obtained powder was loaded in a mold, and sintered in a uniaxially pressurized state using a hot pressing apparatus or a spark plasma sintering apparatus, thereby manufacturing the above Bnh, Bnl, Bph and Bpl. The uniaxial pressurization is carried out by exerting a pressure of 100 MPa in a state in which the powder is heated to 450° C. in an argon atmosphere. Needless to say, bulks may be manufactured through an extraction treatment, a rolling treatment, or the like which is accompanied with the above composition change.

The characteristics of the thermoelectric materials manufactured in the above manner at room temperature were as described in Table 1 below:

TABLE 1

| | Concentration of carrier ($m^{-3}$) | Seebeck coefficient ($\mu V/K$) | Electric resistivity ($\Omega \cdot m$) | Thermal conductivity ($W/m \cdot K$) | Performance index ($K^{-1}$) |
|---|---|---|---|---|---|
| n-type high-temperature material: Bnh | $2.4 \times 10^{26}$ | −145 | $0.71 \times 10^{-5}$ | 1.66 | $1.78 \times 10^{-3}$ |
| n-type low-temperature material: Bnl | $3.8 \times 10^{25}$ | −192 | $1.05 \times 10^{-5}$ | 1.24 | $2.83 \times 10^{-3}$ |
| p-type high-temperature material: Bph | $2.2 \times 10^{26}$ | 105 | $0.60 \times 10^{-5}$ | 1.86 | $0.99 \times 10^{-3}$ |
| p-type low-temperature material: Bpl | $4.6 \times 10^{25}$ | 212 | $0.92 \times 10^{-5}$ | 1.28 | $3.81 \times 10^{-3}$ |

For the thermoelectric materials illustrated in Table 1, when the operation temperature is changed from 25 to 300° C., the performance indices temporarily increase, and then decrease in both the n-type and the p-type, and the degree of a decrease in the high-temperature material is smaller than the degree of a decrease in the low-temperature material, and therefore the performance index of the high-temperature becomes higher than the performance index of the low-temperature material in a high temperature range. For example, in the high-temperature material of the n-type thermoelectric material, the performance index is approximately 1.3 (the unit is $10^{-3}$ $K^{-1}$, this shall apply below) at 25° C., and the performance index is changed to 1.9 at 50° C., 2.1 at 100° C., 1.9 at 200° C. and 1.2 at 300° C. In the low-temperature material of the n-type thermoelectric material, the performance index is approximately 3.3 at 25° C., and the performance index is changed to 3.7 at 50° C., 3.0 at 100° C., 1.9 at 200° C. and 0.35 at 300° C. In the high-temperature material of the p-type thermoelectric material, the performance index is approximately 1.0 at 25° C., and the performance index is changed to 1.7 at 50° C., 2.0 at 100° C., 1.8 at 200° C. and 1.1 at 300° C. In the low-temperature material of the p-type thermoelectric material, the performance index is approximately 3.2 at 25° C., and the performance index is changed to 3.5 at 50° C., 2.7 at 100° C., 1.7 at 200° C. and 0.35 at 300° C. Therefore, in all cases, the performance index of the high-temperature material was less than the performance index of the low-temperature material at 50° C., and the performance index of the high-temperature material ws greater than the performance index of the low-temperature material at 300° C.

Furthermore, the obtained bulks Bnh, Bnl, Bph and Bpl were cut using a multi wire saw so as to manufacture wafers (Step S100), and a 10 μm-thick diffusion prevention layer was formed on the surface of each of the wafers through Ni plating (Step S105). In Step S100, the height of the high-temperature material and the height of the low-temperature material were both set to 0.5 mm. Furthermore, Ag paste (for example, NAG-10 manufactured by Daiken Chemical Co., Ltd) was coated between the high-temperature material and the low-temperature material, the high-temperature material and the low-temperature material in a state of being attached together were introduced into a reflow furnace, heated in the atmosphere, and maintained at 350° C. for 60 minutes, thereby sintering the wafers (Step S110). As a result, 38 μm inter-material joining layers were formed through sintering. After that, the sintered wafers were cut using a cutting saw so as to manufacture thermoelectric elements Pn and Pp (Step S115). Herein, the wafers were cut so that the cross-section in the perpendicular direction to the heights of the thermoelectric elements Pn and Pp became 0.6 mm×0.6 mm. Therefore, the sizes of the thermoelectric elements are almost 1 mm×0.6 mm×0.6 mm. In addition, herein, 100 thermoelectric elements Pn and 100 thermoelectric elements Pp were manufactured.

Furthermore, 100 sets of the n-type thermoelectric element Pn and the p-type thermoelectric element Pp were disposed between two ceramic substrates (alumina substrates, 0.5 mm×10 mm×11 mm), a previously determined pattern of electrodes were formed on the respective substrates so that the n-type thermoelectric elements Pn and the p-type thermoelectric elements Pp could be electrically connected in series in the order of n-type and p-type (Step S120), and 10 μm diffusion prevention layers were formed on the electrode surfaces of the substrates through Ni plating (Step S125). Furthermore, Ag paste (for example, NAG-10 manufactured by Daiken Chemical Co., Ltd) was coated on the diffusion prevention layer on the electrode (Step S130), the thermoelectric elements manufactured in Step S115 were mounted on the Ag paste (Step S135), the substrates were placed on the thermoelectric elements (Step S140), and sintering was carried out in a reflow furnace (Step S145). The sintering was carried out by setting the pressure in the reflow furnace to the atmosphere, heating the substrates, and holding the substrates at 300° C. for 60 minutes. As a result, a 46 μm element-electrode joining layer was formed by sintering. Furthermore, the substrates were removed from the reflow furnace after the sintering, and wiring electrodes were wired, thereby manufacturing a thermoelectric conversion module. The thermoelectric conversion module manufactured in the above manner will be used as a reference sample, and the characteristics of a variety of samples will be compared below. For the respective samples of the examples below, parameters other than the parameters mentioned in the descriptions of the respective examples (the kind, thickness and the like of metal) are the same as in the reference sample.

Table 2 describes the effects of the formation of the element-electrode diffusion prevention layer between the electrode and the thermoelectric element in Step S105 and Step S125.

TABLE 2

| Diffusion prevention layer | Decrease of power generation electric power | | | |
|---|---|---|---|---|
| | 3 months | 6 months | 12 months | 24 months |
| None | 1% | 4% | broken | broken |
| Ni | 0.2% | 0.2% | 0.4% | 1.1% |
| Au | 0.2% | 0.2% | 0.3% | 0.7% |
| Pd | 0.2% | 0.2% | 0.2% | 0.3% |
| Cr | 0.3% | 0.4% | 0.5% | 0.6% |
| Ti | 0.1% | 0.1% | 0.2% | 0.4% |

Table 2 describes the time dependency of the power generation electric power decrease rate in the samples manufactured using the above manufacturing method by forming the element-electrode diffusion prevention layer of Step S105 and Step S125 using the respective elements illustrated in the left column. The sample on the second row in Table 2 is the reference sample, and other samples are samples for which the element-electrode diffusion prevention layers formed in Step S105 and Step S125 were changed to something else in the manufacturing step of the reference sample. In addition, "None" represents samples for which Step S105 and Step S125 were not carried out. In Table 2, the power generation electric power immediately after manufacturing and the power generation electric power after 3 months, 6 months, 12 months and 24 months have elapsed after manufacturing are compared, the power generation electric power decrease rate is computed, and illustrated. As such, in a case in which the element-electrode diffusion prevention layer is not present, elements diffuse between the electrode and the element-electrode joining layer or between the element-electrode joining layer and the thermoelectric element, and the power generation electric power decreases as time elapses. In addition when the elapsed time after manufacturing becomes long, the element-electrode joining layer is broken such that the thermoelectric conversion module becomes unavailable. On the other hand, even in a case in which any of the element-electrode diffusion prevention layers are formed, a decrease in the power generation electric power due to the elapsing of time is suppressed. In addition, the breakage of the element-electrode joining layer can be prevented.

The power generation electric power illustrated in Table 2 was measured using the thermoelectric conversion module manufactured in the above manner. That is, during the measurement, a Peltier device for temperature adjustment was brought into contact with the low-temperature portion of the thermoelectric conversion module so as to hold the substrate of the low-temperature portion at 50° C., and a heater was brought into contact with the high-temperature portion so as to hold the substrate of the high-temperature portion at 300° C. In addition, in this state, a lead extending from the electrode in the thermoelectric conversion module was connected to an additional external resistance apparatus, and the voltage and the current were measured while changing the additional external resistance, thereby measuring the power generation electric power.

The sintering temperature in Step S145 is a temperature at which the metal particles in the paste coated in Step S130 are coarsened, and the crystal grains in the thermoelectric elements Pn and Pp are not coarsened. Table 3 illustrates the joining properties of the element-electrode joining layers at a plurality of sintering temperatures in a case in which paste including metal particles smaller than 100 nm and paste including metal particles of 100 nm or more were coated on the electrodes which formed the element-electrode diffusion prevention layers in Step S125, furthermore, the temperature of the reflow furnace was increased at a predetermined temperature-increase rate in Step S145, and sintering was carried out at a predetermined sintering temperature for 60 minutes.

TABLE 3

|    | Grain diameter    | 150° C. | 200° C. | 250° C. | 300° C. | 350° C. |
|----|-------------------|---------|---------|---------|---------|---------|
| Ag | Less than 100 nm  | x       | x       | o       | o       | o       |
|    | 100 nm or more    | x       | x       | x       | x       | Δ       |
| Al | Less than 100 nm  | x       | o       | o       | o       | o       |
|    | 100 nm or more    | x       | x       | Δ       | Δ       | Δ       |
| Cu | Less than 100 nm  | x       | x       | x       | x       | o       |
|    | 100 nm or more    | x       | x       | x       | x       | Δ       |
| Ti | Less than 100 nm  | x       | x       | o       | o       | o       |
|    | 100 nm or more    | x       | x       | x       | x       | Δ       |
| Cr | Less than 100 nm  | x       | x       | x       | o       | o       |
|    | 100 nm or more    | x       | x       | x       | x       | Δ       |

Here, the sample described in the cell of Ag, less than 100 nm and 300° C. in Table 3 is the reference sample, and other samples in Table 3 are samples for which the kind of the metal, the sintering temperature and the size of the particles in the paste are changed. Table 3 describes the comparison between the electric resistance values computed from the electric resistivity of the high-temperature material and the low-temperature material respectively used in the thermoelectric elements Pn and Pp and the electric resistance values actually measured in the actual manufactured thermoelectric conversion module. Samples with an increase of the actual measured value with respect to the computed value of less than 10% are indicated using a circle, and samples with an increase of 10% to less than 20% are indicated using Δ. In addition, x indicates samples in which the electrode and the thermoelectric element are not joined.

As described above, when paste including Ag particles less than 100 nm is used, it is possible to manufacture a thermoelectric conversion module having an element-electrode joining layer in which the electric resistance value sufficiently decreases at a sintering temperature in a range of 250 to 350° C. In addition, when paste including Al particles less than 100 nm is used, it is possible to manufacture a thermoelectric conversion module having an element-electrode joining layer in which the electric resistance value sufficiently decreases at a sintering temperature in a range of 200° C. to 350° C. When paste including Cu particles less than 100 nm is used, it is possible to manufacture a thermoelectric conversion module having an element-electrode joining layer in which the electric resistance value sufficiently decreases at a sintering temperature of 350° C. When paste including Ti particles less than 100 nm is used, it is possible to manufacture a thermoelectric conversion module having an element-electrode joining layer in which the electric resistance value sufficiently decreases at a sintering temperature in a range of 250 to 350° C. When paste including Cr particles less than 100 nm is used, it is possible to manufacture a thermoelectric conversion module having an element-electrode joining layer in which the electric resistance value sufficiently decreases at a sintering temperature in a range of 300 to 350° C. When an increase of the electric resistance value from the computed value of 10% to less than 20% is permitted, it is possible to form an element-electrode joining layer using paste including metal particles of 100 nm or more like samples with Δ in Table 3.

Table 4 describes the effect of 30 μm or more of an element-electrode joining layer formed between the electrode and the thermoelectric element by the sintering of Step S145.

TABLE 4

| Thickness of joining layer (μm) | Number of cycles until fracture |
|---------------------------------|---------------------------------|
| 15                              | 2321                            |
| 22                              | 8362                            |
| 28                              | 18726                           |
| 30                              | 20324                           |
| 35                              | 22678                           |
| 40                              | 25839                           |
| 50                              | 27981                           |

Table 4 describes examples of cases in which thermoelectric conversion modules are manufactured by sintering with various amounts of Ag paste coated between the thermoelectric element and the electrode, and describes the number of cycles until the element-electrode joining layer is fractured for every thickness of the element-electrode joining layer formed between the thermoelectric element and the electrode. Herein, a step of holding a state in which the substrate of the high-temperature portion reaches 300° C. and the substrate of the low-temperature portion reaches 50° C. in the thermoelectric conversion module for 5 minutes, then, cooling the entire thermoelectric conversion module to 25° C. and holding the thermoelectric conversion module for 5 minutes is considered as one cycle. As described in Table 4, the necessary number of cycles until the element-electrode joining layer is fractured increases as the thickness of the element-electrode joining layer increases, and, in a case in which the thickness of the element-electrode joining layer is 30 μm or more, the element-electrode joining layer is fractured at 20000 cycles or more. Therefore, when the thickness of the element-electrode joining layer is 30 μm or more, the element-electrode joining layer is not fractured until the number of cycles at which the element-electrode joining layer is sufficiently available is reached, and it is found that the element-electrode joining layer of 30 μm or more contributes to the mitigation of thermal stress.

(3) Alternative Embodiment

The invention can be employed in a variety of embodiments other than the above embodiment. In addition, it is possible to set a variety of elements as the invention specific items. The element-electrode joining layer may be configured only of an element-electrode joining layer formed by sintering paste including metal particles smaller than 100 nm as in the above embodiment, but the element-electrode joining layer may include a layer formed using another method, and, for example, a configuration in which some of the element-electrode joining layer is formed through metal plating can be employed.

In this case, the plated layer is preferably a plated layer using the same metal as metal particles smaller than 100 nm which are included in the paste. That is, when a plated layer made of the same metal as metal particles included in the paste before sintering is formed in at least one of the electrode and the thermoelectric element, and sintering is carried out in a state in which the plated layer and the paste are in contact with each other, since the metal particles and the plated layer are easily sintered during the sintering, it is possible to make the strength of the element-electrode joining layer high.

Furthermore, the sintering may be carried out in a state in which a pressure is applied from the electrode and the thermoelectric element toward the element-electrode joining layer. According to this configuration, it is possible to decrease the content rate of voids in the element-electrode joining layer compared to a non-pressurized state, and the electric resistance in the element-electrode joining layer can be decreased.

Table 5 describes the characteristics of a variety of examples and comparative examples.

TABLE 5

| Pressure (MPa) | Before sintering (μm) | After sintering (μm) | Porosity (%) | Resistance ratio |
|---|---|---|---|---|
| 0 | 60 | 46 | 28 | 1.06 |
| 1 | 60 | 42 | 24 | 1.04 |
| 4 | 60 | 38 | 21 | 1.04 |
| 5 | 60 | 35 | 16 | 1.02 |
| 10 | 60 | 33 | 14 | 1.01 |
| 5 | 10 | 48 | 8 | 1.01 |
| 0 | 32 | 12 | 18 | 1.12 |

Examples described in 1st to 5th rows in Table 5 are examples of cases in which thermoelectric conversion modules were manufactured by coating Ag paste between the thermoelectric element in which the element-electrode diffusion prevention layer is formed using Ni and the electrode, and sintering was carried out while the respective pressures described in the right column were exerted between the thermoelectric element and the electrode. The sample with a pressure of 0 MPa is the above reference sample, and other samples were manufactured by changing the pressure exerted between the electrode and the thermoelectric element in the manufacturing step of the reference sample. In the respective samples, the thicknesses of the Ag paste before sintering were the same, but the thicknesses of the element-electrode joining layer after sintering become thinner as the pressure increases. That is, in a case in which sintering is carried out in a state in which the same amount of Ag paste is coated, the density of Ag in the element-electrode joining layer increases as the pressure increases.

Table 5 describes the porosity and resistance ratios of the element-electrode joining layers in the respective samples. Herein, the porosity refers to the area proportion of voids obtained by measuring the element-electrode joining layer using an ultrasonic test equipment. In addition, the resistance ratio refers to a ratio between the electric resistance value computed from the electric resistivity of the high-temperature material and the low-temperature material used in the thermoelectric elements Pn and Pp and the electric resistance value actually measured in the actual manufactured thermoelectric conversion module.

As described in Table 5, as the pressure increases, the porosity decreases, and the resistance ratio decreases. Therefore, it is possible to manufacture an element-electrode joining layer having a smaller electric resistance value by carrying out sintering with a pressure exerted.

The example described in the 6th row in Table 5 is an example of a case in which element-electrode diffusion prevention layers are formed respectively at the thermoelectric element and the electrode, and then Ag plating is carried out on the element-electrode diffusion prevention layers. That is, the example is an example in which the thermoelectric element is mounted in a state in which Ag paste is coated on a Ag-plated layer on the element-electrode diffusion prevention layer, placed on a substrate, sintered, and the element-electrode joining layer is configured of a plated layer, a sintered layer and a plated layer. In this example, the thickness of the plated layer is 20 μm. In addition, from the fact that the thickness of the Ag paste before sintering is 10 μm, and the thickness of the element-electrode joining layer after sintering is 48 μm as described in the $6^{th}$ row in Table 5, it is found that the element-electrode sintered layer derived from the Ag paste is approximately 8 μm. Even in this example, a pressure (5 MPa) is exerted between the electrode and the thermoelectric element. Even in this example, since the porosity is as small as 8%, and the resistance ratio is as small as 1.01, an element-electrode joining layer having an extremely small electric resistance value is manufactured. In addition, as a result of carrying out the same test as in Table 4 in this example, it was confirmed that the number of cycles until the fracture was 20842 cycles, and the element-electrode joining layer was strongly joined even in an example in which the element-electrode joining layer was configured of a plated layer, a sintered layer and a plated layer.

In order to form an element-electrode joining layer with a desired thickness, Ag paste having a weight ratio of Ag particles of 80% or more is preferably used. The example described in the 7th row in Table 5 is an example of a case in which a thermoelectric conversion module is manufactured using Ag paste having a weight ratio of Ag particles of 62%. In this example, since the weight ratio of Ag particles is small, and the fluidity of the paste is high, it is difficult to set the thickness of the Ag paste before sintering to an arbitrary thickness. In addition, when an element-electrode joining layer was formed by sintering Ag paste whose thickness had been 32 μm before sintering, the thickness of the Ag paste became 12 μm. In this case, the porosity is 18%, which is a favorable value, but the resistance ratio increases to 1.12. In addition, as a result of carrying out the same test as in Table 4 in this example, it could be confirmed that the number of cycles until the fracture was 3492, and a sufficient strength could not be ensured.

In a configuration in which the element-electrode joining layer is made up of a plated layer and a sintered layer as described above, there are many cases in which the average grain diameters are different between the plated layer and the sintered layer. That is, a first layer having an average crystal grain diameter of more than 1 μm and less than or equal to 10 μm is formed by sintering paste including metal particles smaller than 100 nm, and a second layer having an average crystal grain diameter of more than 10 μm is formed through plating. Therefore, the invention may be realized by manufacturing a thermoelectric conversion module having an element-electrode joining layer which includes the first layer and the second layer having the above average crystal grain diameters. Herein, the first layer is a sintered layer, but the second layer may be formed by a manufacturing method other than plating.

Table 6 is a table in which the average crystal grain diameters of Ag particles in the first layer and the second layer are compared.

TABLE 6

| | Before sintering (μm) | After sintering (μm) |
|---|---|---|
| First layer | 0.058 | 6 |
| Second layer: thermoelectric element side | 13 | 15 |
| Second layer: substrate side | 12 | 15 |

Here, the crystal grain diameters after sintering in the first layer, before and after sintering in the second layer can be defined as, for example, the radius of a circle having the same area as the area of crystal grains in a certain cross-section. In addition, the average crystal grain diameter is a value obtained by measuring a cross-section in a perpendicular direction to the thickness direction of the element-electrode joining layer using, for example, an electron back scatter diffraction (EBSD) apparatus manufactured by TSL, and from averaging crystal grain diameters from a plurality of locations and a plurality of cross-sections in the cross-section. In addition, the average crystal grain diameter in the first layer before sintering is the average size of Ag particles diffused in the paste. As described in Table 6, the average crystal grain diameter in the first layer derived from the Ag paste is 6 µm (more than 1 µm and less than 10 µm), and the average crystal grain diameter in the second layer is 15 µm. Therefore, when the first layer having an average crystal grain diameter of more than 1 µm and less than or equal to 10 µm and the second layer having an average crystal grain diameter of more than 10 µm are configured, it is possible to make an element-electrode joining layer having a small electric resistance value and a high strength.

Furthermore, in a case in which at least some of the element-electrode joining layer is formed by sintering the paste, there are many cases in which portions in contact with the paste before sintering are oxidized such that the concentration of oxygen locally increases. Therefore, the concentration of oxygen is high at two portions which interpose the paste before sintering. In addition, each time the sintering using the paste is repeated, two more portions have a high concentration of oxygen. Therefore, according to the invention, it is also possible to form an element-electrode joining layer including a plurality of layers with a high concentration of oxygen in which the change in the concentration of oxygen in the thickness direction exceeds a predetermined reference.

Figure 5A:
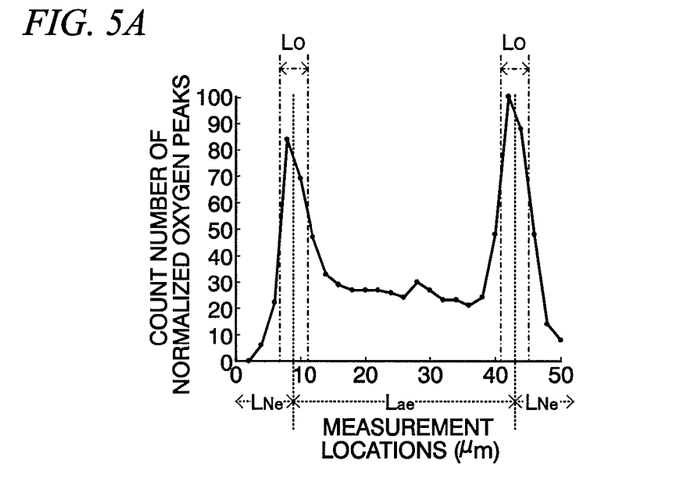
FIGS. 5A and 5B are graphs illustrating the concentrations of oxygen in a joining layer in the thermoelectric conversion module according to the embodiment of the invention.
Figure 5B:
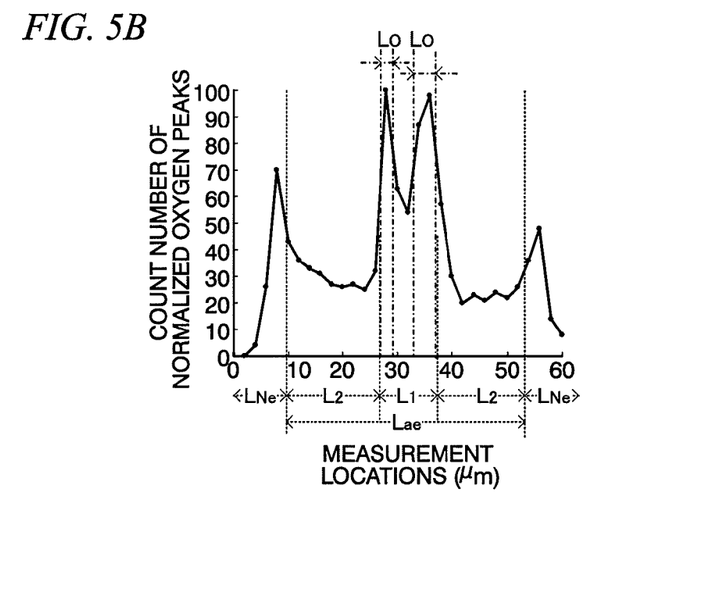

FIGS. 5A and 5B are views illustrating the concentration of oxygen in the element-electrode joining layer, and illustrate the concentration of oxygen measured at various measurement locations in the thickness direction of the element-electrode joining layer. In FIGS. 5A and 5B, the measurement locations are illustrated in the transverse axis, the evaluation results of the concentration of oxygen using Auger electron spectroscopy are illustrated in the vertical axis, and, herein, the peak of the measured concentrations of oxygen is normalized to 100. In addition, in FIG. 5A, the locations of the Ni-plated layer $L_{Ne}$ and the element-electrode joining layer Lae formed by sintering the Ag paste are illustrated using broken arrows, and in FIG. 5B, the locations of the Ni-plated layer $L_{Ne}$ the first layer $L_1$, the second layer $L_2$ and the element-electrode joining layer Lae are illustrated using broken line arrows. Both FIGS. 5A and 5B illustrate a state in which the thermoelectric element is present on the left side of the graph, and the electrode is present on the right side of the graph.

As illustrated in FIG. 5A, the concentration of oxygen increases at the interface between the Ni-plated layer $L_{Ne}$ and the element-electrode joining layer Lae, and decreases in other areas. As a result, the change in the concentration of oxygen in the thickness direction of the element-electrode joining layer exceeds a predetermined reference (threshold) at a certain location, and a layer having this location as the interface can be defined as a high oxygen concentration layer. In FIG. 5A, the location of the interface is illustrated using a dashed line, and areas interposed between the interfaces are illustrated as the high oxygen concentration layers Lo. As such, in the element-electrode joining layer Lae, the high oxygen concentration layer Lo is formed due to oxygen included in the Ag paste, and, in a case in which sintering is carried out once as in the example, the high oxygen concentration layers Lo are formed at two places. Therefore, it is also possible to realize the invention with the element-electrode joining layer La as in the example including a plurality of the high oxygen concentration layers Lo.

Similarly, in the element-electrode joining layer Lae as illustrated in FIG. 5B, the concentration of oxygen increases at the interface between the first layer $L_1$ and the second layer $L_2$ as illustrated in FIG. 5B, and decreases in other areas. As a result, the change in the concentration of oxygen in the thickness direction of the element-electrode joining layer exceeds a predetermined reference (threshold) at a certain location, and a layer having this location as the interface can be defined as the high oxygen concentration layer. In FIG. 5B as well, the location of the interface is illustrated using a dashed line, and areas interposed between the interfaces are illustrated as the high oxygen concentration layers Lo. As such, in the element-electrode joining layer Lae, the high oxygen concentration layer Lo is formed due to oxygen included in the Ag plate, which serves as the base of the second layer $L_2$, and the Ag paste. In a case in which sintering is carried out once as in the example, the high oxygen concentration layers Lo are formed at two places. Therefore, it is also possible to realize the invention with the element-electrode joining layer La as in the example including a plurality of the high oxygen concentration layers Lo.

Furthermore, the element-electrode joining layer may be formed by sintering paste including metal particles smaller than 100 nm, the element-electrode joining layer may be formed by a single process of sintering, and the element-electrode joining layer may be formed by a plurality of times of sintering. For example, an element-electrode joining layer having a desired thickness may be manufactured by repeating a step of coating and sintering paste including metal particles a plurality of times.

Furthermore, in the thermoelectric conversion module of the above embodiment, an example in which the thermoelectric element Pn (Pp) having the high-temperature material Pnh (Pph) and the low-temperature material Pnl (Ppl) joined at the inter-material joining layer Lam is used has been described. However, even in a thermoelectric conversion module in which a thermoelectric element not having such an inter-material joining layer is used, the same element-electrode joining layer Lae can be used.

Figure 6:
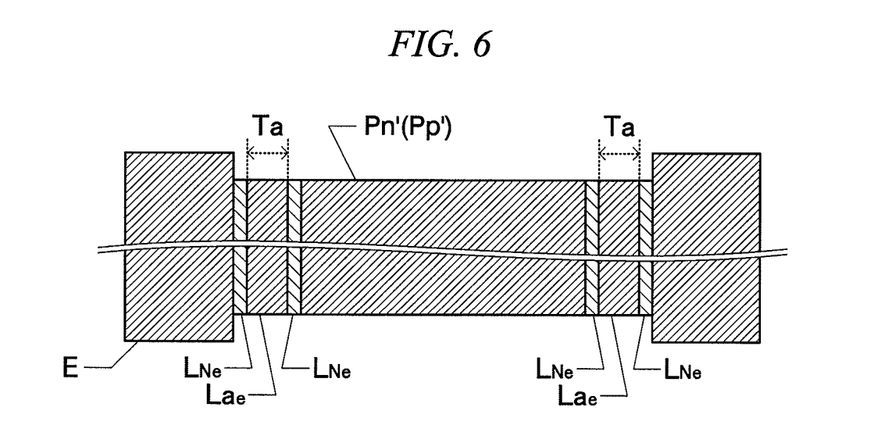
FIG. 6 is a cross-sectional view illustrating the structure between electrodes in a thermoelectric conversion module of another embodiment of the invention.

That is, when FIG. 6 is referenced, in a thermoelectric conversion module of another embodiment, a thermoelectric element Pn' (or Pp') not having the inter-material joining layer Lam is used. Between the electrodes E, a Ni-plated layer (element-electrode diffusion prevention layer) $L_{Ne}$, an element-electrode joining layer formed by the sintering of the paste Lae, a Ni-plated layer (element-electrode diffusion prevention layer) $L_{Ne}$, the thermoelectric element Pn' (or Pp'), a Ni-plated layer (element-electrode diffusion prevention layer) $L_{Ne}$, an element-electrode joining layer formed by the sintering of the paste Lae and a Ni-plated layer (element-electrode diffusion prevention layer) $L_{Ne}$ are formed sequentially in the thickness direction of the thermoelectric element.

It is possible to set the thickness to 30 µm or more by forming the element-electrode joining layer Lae between the electrode E and the thermoelectric element Pn' (or Pp') through the sintering of paste including metal particles smaller than 100 nm. This element-electrode joining layer Lae also has the same structure and properties as the element-electrode joining layer Lae illustrated in FIG. 4.

When the element-electrode joining layer Lae is used, it is possible to mitigate thermal stress caused by the use of the thermoelectric conversion module so as to prevent the breakage of the thermoelectric conversion module.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A thermoelectric conversion module, comprising:
   a first substrate having a first electrode on one of its surfaces;
   a second substrate having a second electrode on one of its surfaces, the first and second electrodes facing one another;
   a thermoelectric element disposed between the first and second electrodes and being electrically connected to the first and second electrodes; and
   a joining layer for joining the first electrode to the thermoelectric element, the joining layer comprising first and second layers, the first layer of the joining layer is formed of a metal, and wherein the first layer of the joining layer has a crystal grain structure, and wherein the crystal grain structure of the first layer has an average crystal grain diameter of more than 1 μm and less than or equal to 10 μm, and wherein the second layer of the joining layer is formed of said metal, and wherein the second layer of the joining layer has a crystal grain structure, and wherein the crystal grain structure of the second layer has an average crystal grain diameter of more than 10 μm.

2. The thermoelectric conversion module according to claim 1, wherein the first and second electrodes lie in parallel planes and the joining layer has a thickness direction extending perpendicular to the parallel planes and an oxygen concentration which varies along the thickness direction, the first layer of the joining layer having a plurality of sub-layers and the oxygen concentration peaking at interfaces between the plurality of the sub-layers of the first layer of the joining layer.

3. The thermoelectric conversion module according to claim 1, wherein the first and second electrodes lie in parallel planes and the joining layer has a thickness direction extending perpendicular to the parallel planes and an oxygen concentration which varies along the thickness direction, the oxygen concentration peaking at an interface between the first and second layers of the joining layer.

4. The thermoelectric conversion module according to claim 1, wherein a diffusion prevention layer is formed between the joining layer and the first electrode or between the joining layer and the thermoelectric elements.

5. The thermoelectric conversion module according to claim 4, wherein the second layer of the joining layer is made of a metal plating.

6. The thermoelectric conversion module according to claim 1, wherein the first layer of the joining layer is formed of a sintered paste having metal particles therein.

7. The thermoelectric conversion module according to claim 6, wherein the first and second electrodes lie in parallel planes and the joining layer has a thickness as measured in a direction extending perpendicular to the parallel planes of at least 30 μm.

8. The thermoelectric conversion module of claim 1, wherein the first layer of the joining layer includes metal particles and the second layer of the joining layer is made of metal plating.

9. The thermoelectric conversion module of claim 1, wherein the metal of the first and second layers of the joining layer includes silver.

* * * * *